US012745039B2

(12) United States Patent
Lu et al.

(10) Patent No.: US 12,745,039 B2
(45) Date of Patent: Sep. 22, 2026

(54) SOUND SIGNAL PROCESSING METHOD AND SOUND SIGNAL PROCESSING DEVICES

(71) Applicant: Tymphany HK Limited, Hong Kong (HK)

(72) Inventors: Ryan Meng-Wei Lu, Taipei City (TW); Tzung-You Tsai, Taipei City (TW)

(73) Assignee: Tymphany HK Limited, Hong Kong (HK)

( * ) Notice: Subject to any disclaimer, the term of this patent is extended or adjusted under 35 U.S.C. 154(b) by 216 days.

(21) Appl. No.: 18/764,913

(22) Filed: Jul. 5, 2024

(65) Prior Publication Data

US 2025/0016503 A1 Jan. 9, 2025

Related U.S. Application Data

(60) Provisional application No. 63/512,127, filed on Jul. 6, 2023.

(51) Int. Cl.
*H04R 3/04* (2006.01)
*H03G 3/00* (2006.01)

(52) U.S. Cl.
CPC ............... *H04R 3/04* (2013.01); *H03G 3/001* (2013.01); *H03G 3/002* (2013.01); *H04R 2430/01* (2013.01)

(58) Field of Classification Search
CPC ...... H04R 3/04; H04R 2430/01; H03G 3/001; H03G 3/002
USPC ........................................................ 381/103
See application file for complete search history.

(56) References Cited

U.S. PATENT DOCUMENTS 7,190,292 B2 * 3/2007 Bizjak .................... H03G 7/002 341/110
8,005,230 B2 * 8/2011 Farinelli, Jr. ............. H03F 3/68 381/55
10,484,784 B1 * 11/2019 Liang ....................... H04R 1/28
2010/0266142 A1 * 10/2010 Huijnen ................. H03G 9/025 381/102
2012/0188111 A1 * 7/2012 Ledzius ............... H03G 3/3005 341/144
2014/0376748 A1 * 12/2014 Okabayashi ............. H03G 3/10 381/120
2016/0111110 A1 * 4/2016 Gautama ............. G10L 21/0316 381/94.3
2022/0225025 A1 * 7/2022 Hasegawa ............ H03G 3/3026

* cited by examiner

*Primary Examiner* — Sean H Nguyen
(74) *Attorney, Agent, or Firm* — MUNCY, GEISSLER, OLDS & LOWE, P.C.

(57) ABSTRACT

A sound signal processing includes obtaining sound signals; amplifying the sound signals based on a plurality of analog gain values to generate a plurality of amplified sound signals, where each amplified sound signal corresponds to a respective analog gain value; digitizing the plurality of amplified sound signals to produce plurality of digital sound signals; determining whether the plurality of digital sound signals are clipped or non-clipping, and selectively outputting the non-clipping sound signals; and applying a dynamic range control program to the non-clipping sound signals to adjust them.

14 Claims, 5 Drawing Sheets

SOUND SIGNAL PROCESSING METHOD AND SOUND SIGNAL PROCESSING DEVICES

CROSS REFERENCE TO RELATED APPLICATIONS

This application claims priority of U.S. Provisional Application No. 63/512,127 filed on Jul. 6, 2023 under 35 U.S.C. § 119(e), the entire contents of which are hereby incorporated by reference.

BACKGROUND

1. Technical Field

The present invention relates to the field of sound processing technology, and more particularly to a sound signal processing method and a sound signal processing device.

2. Description of the Related Art

Recently, the rapid development of science and technology has improved people's quality of life, and the performance of audio devices has been improved accordingly, which has led to an increasing demand for sound quality. A common audio device is, for example, a microphone. Generally speaking, the sound signal received by the microphone undergoes analog-to-digital conversion and appropriate digital signal processing, so that the signal level of the processed sound signal is amplified to an appropriate range. However, if the user speaks loudly while using the microphone, since the operating dynamic range of the analog digital converter is fixed, the signal levels exceeding the operational dynamic range are clipped. This clipping causes distortion in the processed sound signal, which cannot be corrected by subsequent signal processing.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the disclosure was acknowledged by a person of ordinary skill in the art.

SUMMARY

According to the above description, the present application provides a sound signal processing method and a sound signal processing device to address the clipping problem that occurs after the sound signal has been processed.

To achieve the above-mentioned objective, the present application provides a sound signal processing method including: obtaining a sound signal; amplifying the sound signal according to a plurality of analog gain values to generate a plurality of amplified sound signals, wherein the plurality of amplified sound signals correspond to the plurality of analog gain values respectively; digitizing the plurality of amplified sound signals to generate a plurality of digital sound signals; determining whether the plurality of digital sound signals are clipping signals or non-clipping signals, and selectively outputting the non-clipping sound signals; and performing a dynamic range control program on the non-clipping sound signals to adjust the non-clipping sound signals.

According to one embodiment of the present application, the plurality of digital sound signals comprises a first digital sound signal and a second digital sound signal, determining whether the plurality of digital sound signals are the clipping signals or the non-clipping signals, and selectively outputting the non-clipping sound signals includes: outputting the first digital sound signal when the first digital sound signals is determined to be the non-clipping signal; outputting the second digital sound signal when the second digital sound signal is determined to be the non-clipping signal and the first digital sound signal is determined to be the clipping signal.

According to one embodiment of the present application, the plurality of analog gain values include a first analog gain value and a second analog gain value, the first digital sound signal corresponding to the first analog gain value, and the second digital sound signal corresponding to the second analog gain value, the dynamic range control program comprises a digital gain value, and when outputting the second digital sound signal, performing the dynamic range control program on the non-clipping sound signals to adjust the non-clipping sound signals, includes: performing subtraction between the first analog gain value and the second analog gain value to generate a difference; adjusting the digital gain value according to the difference; and, performing the dynamic range control program on the non-clipping sound signals according to the adjusted digital gain value to adjust the non-clipping sound signals.

According to one embodiment of the present application, a determination time-point for determining whether the first digital sound signal is the clipping sound signal or the non-clipping sound signal is earlier than the determination time-point for determining whether the second digital sound signal is the clipping sound signal or the non-clipping sound signal.

According to one embodiment of the present application, the plurality of digital sound signals includes a first digital sound signal and a plurality of second digital sound signals, determining whether the plurality of digital sound signals are the clipped sound signals or the non-clipping sound signals, and selectively outputting the non-clipping sound signals, includes: when the first digital sound signal is determined to be the non-clipping sound signal, outputting the first digital sound signal; and, when at least one of the plurality of second digital sound signals is determined to be the non-clipping sound signal, and both the first digital sound signal and at least one of the plurality of second digital sound signals was determined earlier than the at least one of the plurality of second digital sound signals is being determined to be the non-clipping sound signal are the clipping sound signals, outputting the second digital sound signal that is being determined to be the non-clipping sound signal.

According to one embodiment of the present application, the plurality of analog gain values comprises a first analog gain value and a plurality of second analog gain values, the first digital sound signal corresponds to the first analog gain value, and the plurality of second digital sound signals respectively correspond to the plurality of second analog gain values; the dynamic range control program includes a digital gain values, and when outputting the second digital sound signal that is being determined to be the non-clipping sound signal, performing the dynamic range control program on the non-clipping sound signal to adjust the non-clipping sound signals, includes: performing subtraction between the first analog gain value and the corresponding second analog gain value to generate a difference; adjusting the digital gain value according to the difference; and, performing the dynamic range control program on the non-clipping sound signals according to the adjusted digital gain value.

According to one embodiment of the present application, the determination time-point for determining whether the first digital sound signal is the clipping signal or non-clipping signal is earlier than a plurality of the determination time-points for determining whether the plurality of second digital sound signals are clipping signals or non-clipping signals; a chronical sequence for determining whether the plurality of second digital sound signals are the clipping signals or the non-clipping signals is determined based on a numerical order of the plurality of second analog gain values.

According to one embodiment of the present application, the method further includes performing a cross-fade processing on the non-clipping sound signals.

To achieve the above-mentioned objective, the present application provides a sound signal processing device including an audio device, a pre-amplifier, an analog digital converter, a microprocessor, and a controller. The audio device is applied for obtaining a sound signal. The pre-amplifier connects to the audio device and has a plurality of analog gain values. The pre-amplifier amplifies the sound signal according to a plurality of analog gain values to generate a plurality of amplified sound signals, wherein the plurality of amplified sound signals corresponds to the plurality of analog gain values, respectively. The analog digital converter connects to the pre-amplifier and digitizes the plurality of amplified sound signals to generate a plurality of digital sound signals. The microprocessor connects to the analog digital converter and receives the plurality of digital sound signals. The controller connects to the analog digital converter and the microprocessor and determines whether the plurality of digital sound signals are clipping signals or non-clipping signals, and selectively outputs the non-clipping sound signals and performs a dynamic range control program on the non-clipping sound signals to adjust the non-clipping sound signals.

According to one embodiment of the present application, the plurality of digital sound signals includes a first digital sound signal and a second digital sound signal, the controller determines whether the plurality of digital sound signals are the clipping signals or the non-clipping signals, and controlling the microprocessor to selectively output the non-clipping sound signals includes: when the first digital sound signal is determined to be the non-clipping signal, the controller controls the microprocessor to output the first digital sound signal; when the second digital sound signal is determined to be the non-clipping signal and the first digital sound signal is determined to be the clipping signal, the controller controls the microprocessor to output the second digital sound signal.

According to one embodiment of the present application, the microprocessor connects to the pre-amplifier, the plurality of analog gain values include a first analog gain value and a second analog gain value, the first digital sound signal corresponding to the first analog gain value, and the second digital sound signal corresponding to the second analog gain value, the dynamic range control program includes a digital gain value, and when outputting the second digital sound signal, the controller controls the microprocessor to perform the dynamic range control program on the non-clipping sound signals to adjust the non-clipping sound signals, includes: performing subtraction between the first analog gain value and the second analog gain value to generate a difference; adjusting the digital gain value according to the difference; and, performing the dynamic range control program on the non-clipping sound signals according to the adjusted digital gain value to adjust the non-clipping sound signals.

According to one embodiment of the present application, a determination time-point for determining whether the first digital sound signal is the clipping sound signal or the non-clipping sound signal is earlier than the determination time-point for determining whether the second digital sound signal is the clipping sound signal or the non-clipping sound signal.

According to one embodiment of the present application, the plurality of digital sound signals comprises a first digital sound signal and a plurality of second digital sound signals, the controller determines whether the digital sound signals are the clipped sound signals or the non-clipping sound signals, and controls the microprocessor selectively output the non-clipping sound signals includes: when the first digital sound signal is determined to be the non-clipping sound signal, the controller controls the microprocessor output the first digital sound signal; and, when at least one of the plurality of second digital sound signals is determined to be the non-clipping sound signal, and both the first digital sound signal and at least one of the plurality of second digital sound signals was determined earlier than the at least one of the plurality of second digital sound signals is being determined to be the non-clipping sound signal are the clipping sound signals, the controller controls the microprocessor to output the second digital sound signal that is being determined to be the non-clipping sound signal.

According to one embodiment of the present application, the microprocessor connects to the pre-amplifier, the plurality of analog gain values include a first analog gain value and a plurality of second analog gain values, the first digital sound signal corresponds to the first analog gain value, and the plurality of second digital sound signals respectively correspond to the plurality of second analog gain values; the dynamic range control program includes a digital gain values, and when outputting the second digital sound signal that is being determined to be the non-clipping sound signal, the controller controls the microprocessor to perform the dynamic range control program on the non-clipping sound signal to adjust the non-clipping sound signals, includes: performing subtraction between the first analog gain value and the corresponding second analog gain value to generate a difference; adjusting the digital gain value according to the difference; and performing the dynamic range control program on the non-clipping sound signals according to the adjusted digital gain value.

According to one embodiment of the present application, the determination time-point for determining whether the first digital sound signal is the clipping signal or non-clipping signal is earlier than a plurality of the determination time-points for determining whether the second digital sound signals are clipping signals or non-clipping signals; a chronical sequence for determining whether the plurality of second digital sound signals are the clipping signals or the non-clipping signals is determined based on a numerical order of the plurality of second analog gain values.

According to one embodiment of the present application, the controller controls the microprocessor to perform a cross-fade processing on the non-clipping sound signals.

In summary, the sound signal processing method and device of this application amplify sound signals based on a plurality of analog gain values to generate a plurality of amplified sound signals, and digitize the plurality of the amplified sound signals to generate the plurality of digital sound signals, and then determine whether the plurality of the digital sound signals are clipping signals or non-clipping signals, and selectively output the non-clipping signals, and subsequently perform a dynamic range control program on the non-clipping signals. Therefore, after the aforementioned signal processing, no clipping occurs in the sound signal.

The above explanation is merely an overview of the technical solution in this application. In order to provide a clearer understanding of the technical means of this application and to facilitate implementation in accordance with the specification, the following detailed description of preferred embodiments of this application, accompanied by drawings, is provided.

BRIEF DESCRIPTION OF THE DRAWINGS

FIG. 1 illustrates the configuration diagram of the sound signal processing device according to an embodiment of the present application;

DETAILED DESCRIPTION OF THE EMBODIMENTS

Figure 2:
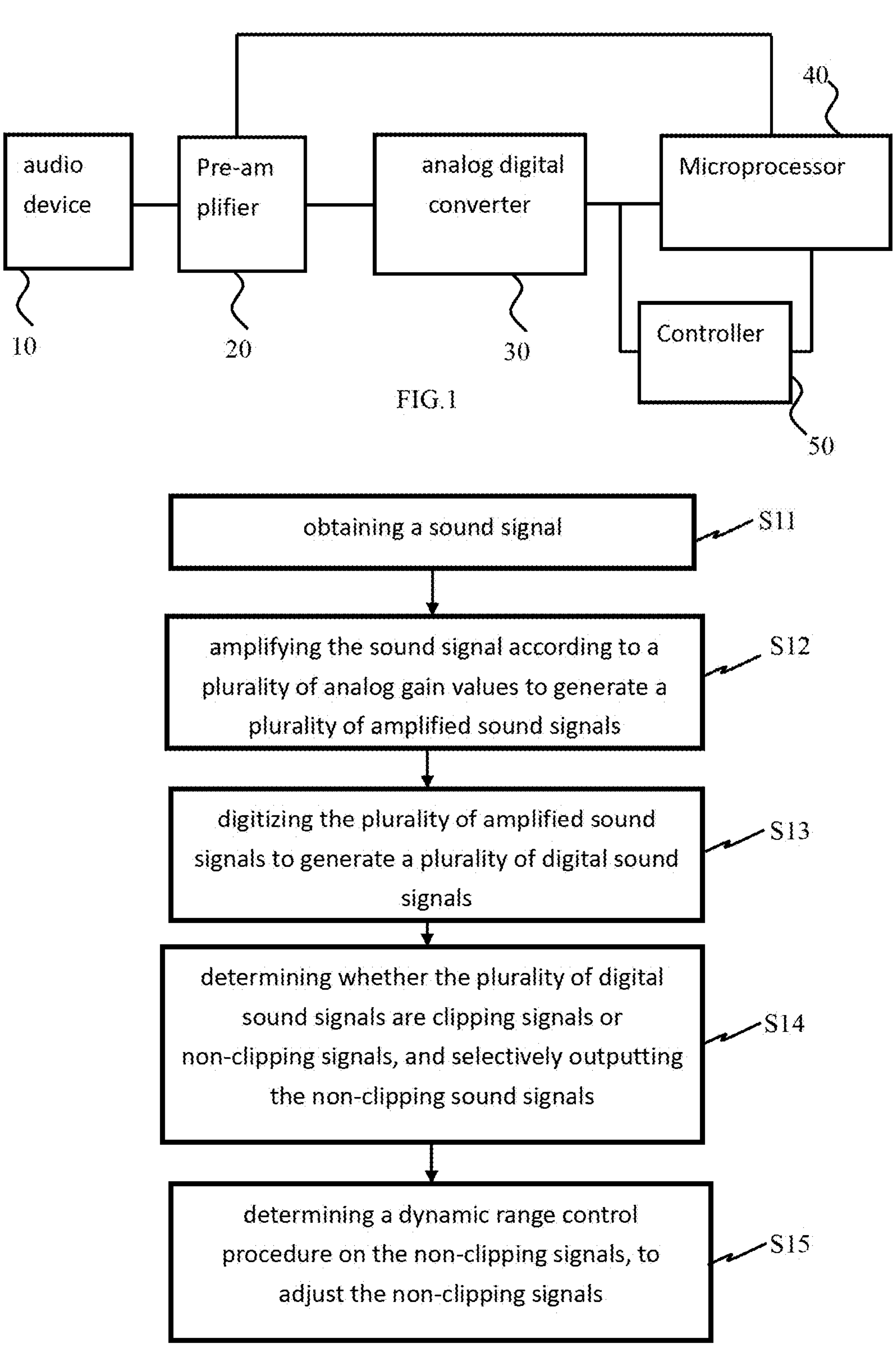
FIG. 2 is a flowchart of the sound signal processing method according to an embodiment of the present application.

It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

FIG. 1 illustrates the configuration diagram of the sound signal processing device according to an embodiment of the present application. As shown in FIG. 1, the sound signal processing device includes an audio device 10, a pre-amplifier 20, an analog digital converter 30, a microprocessor 40 and a controller 50. The audio device 10 obtains sound signals, which are analog signals and can be, for example, human voices. The pre-amplifier 20 connects to the audio device 10 and has a plurality of analog gain values, the pre-amplifier 20 amplifies the sound signals according to the plurality of analog gain values to generate a plurality of amplified sound signals, wherein the amplified sound signals respectively correspond to the plurality of analog gain values. The analog digital converter 30 connects to the pre-amplifier 20 and digitizes the plurality of amplified sound signals to generate a plurality of digital sound signals. The microprocessor 40 connects to the analog digital converter 30 and the pre-amplifier 20. The microprocessor 40 receives the plurality of digital sound signals. The controller 50 connects to the analog digital converter 30 and the microprocessor 40. The controller 50 determines whether the digital sound signals are clipping signals or non-clipping signals, and controls the microprocessor 40 to output the digital sound signals that are non-clipping signals based on control signals. Additionally, the controller 50 controls the microprocessor 40 to perform digital signal processing on the digital sound signals belonging to non-clipping signals. Details regarding the criteria for determining whether digital sound signals are clipping signals or non-clipping signals and details for performing digital signal processing on the non-clipping signals will be described in the paragraphs of the sound signal processing method.

Clipping signals refer to digital sound signals that have undergone clipping. Non-clipping signals refer to digital sound signals without clipping. The digital sound signals include a plurality of audio frames. For instance, digital sound signals include 6 audio frames, and the number of audio frames can vary depending on factors such as the duration, frequency, amplitude, waveform, and sampling rate of the analog digital converter 30. The actual number of audio frames is not limited and can vary accordingly.

The audio device 10 can be a microphone, a recording device, or any other device capable of receiving audio signals. The pre-amplifier 20 can be an operational amplifier or another type of amplifier. The above-mentioned audio device 10 and the pre-amplifier 20 are provided as examples for illustration purposes and are not limited to those specifically stated in this application.

In one embodiment, a plurality of digital sound signals includes a first digital sound signal and a second digital sound signal. The analog gain values include a first analog gain value and a second analog gain value, the first digital sound signals corresponds to the first analog gain value, the second digital sound signals corresponds to the second analog gain value, the first analog gain value is greater than the second analog gain value. The controller 50 first determines whether the first digital sound signal is a clipping signal or a non-clipping signal. When the first digital sound signal is determined to be the non-clipping signal, the controller 50 controls the microprocessor 40 to output the first digital sound signal: when the first digital sound signal is determined to be the clipping signal, the controller 50 then to determine whether the second digital sound signal is the clipping signal or the non-clipping signal. When the second digital sound signal is determined to be the non-clipping signal, the controller 50 controls the microprocessor 40 to output the second digital sound signal and controls the microprocessor 40 to perform digital signal processing on the second digital sound signal according to the first analog gain value and the second analog gain value.

In another embodiment, the plurality of digital sound signals includes a first digital sound signal and a plurality of second digital sound signals, the plurality of analog gain values includes a first analog gain value and a plurality of second analog gain values, the first digital sound signal corresponds to the first analog gain value, the plurality of second digital sound signals respectively corresponds to the plurality of second analog gain values, the first analog gain value is greater than the plurality of second analog gain values, the analog gain value of the plurality of second analog gain value decrease sequentially. The controller 50 first determines whether the first digital sound signal is the clipping signal or the non-clipping signal. When the first digital sound signals are determined to be the non-clipping signal, the controller 50 outputs the first digital sound signals; when the first digital sound signals are determined to be the clipping signal, the controller 50 then sequentially determines whether each of the plurality of second digital sound signals is the clipping signal or the non-clipping signal. Until one of the plurality of second digital sound signals is determined to be the non-clipping signal, the controller 50 determines at least one of second digital sound signals existed earlier than the determination time point that determining one of the plurality of second digital sound signals is the non-clipping signal is clipping signals, and then stops determining whether the remaining the plurality of second digital sound signals after the determination time-point that one of the plurality of second digital sound signals has been determined to be the non-clipping signal is clipping signals or non-clipping signals. Subsequently, the controller 50 controls the microprocessor 40 to output the second digital sound signal that is determined to be the non-clipping signal. The microprocessor 40 is also directed by the controller 50 to perform digital signal processing on the non-clipping signals according to the first analog gain value and the corresponding second analog gain value.

FIG. 2 illustrates a flowchart of the sound signal processing method according to an embodiment of the present application. As shown in FIG. 2, the sound signal processing method of the present application includes steps S11 to S15. The sound signal processing method shown in FIG. 2 can be applied to the sound signal processing device shown in FIG. 1 but is not limited thereto. The following is an illustrative explanation of steps S11 to S15 based on the operation of the sound signal processing device shown in FIG. 1.

StepS11: obtaining a sound signal. As previously described, the audio device 10 obtains a sound signal, and the sound signal is transmitted to the pre-amplifier 20.

Step S12: amplifying the sound signal according to a plurality of analog gain values to generate a plurality of amplified sound signals. Specifically, the pre-amplifier 20 amplifies the sound signal using a plurality of analog gain values, thereby outputting a plurality of amplified sound signals. Subsequently, the pre-amplifier 20 transmits the plurality of amplified sound signals to the analog digital converter 30 and the pre-amplifier 20 transmits the plurality of analog gain values to the microprocessor 40.

Step S13: digitizing the plurality of amplified sound signals to generate a plurality of digital sound signals. Specifically, the analog digital converter 30 performs analog-to-digital conversion on the plurality of amplified sound signals, thereby outputting the plurality of digital sound signals.

Step S14: determining whether the plurality of digital sound signals are clipping signals or non-clipping signals, and selectively outputting the non-clipping sound signals. Specifically, the controller 50 determines whether each of the plurality of digital sound signals is a clipping signal or a non-clipping signal according to the waveforms of the plurality of digital sound signals. Additionally, the controller 50 determines whether the signal level of each digital sound signal remains at a specific level (e.g., 0 dbFS) for a period of time. Taking single digital sound signal as an example, the controller 50 retrieves the signal level from the analog digital converter 30, if the signal level of the digital sound signal remains at a specific level (e.g., 0 dbFS) for a duration (e.g., 3 seconds), the controller 50 determines that this digital sound signal is clipping. Therefore, this digital sound signal is classified as a clipping signal. The determination for clipping of the remaining plurality of digital sound signals follows the same process as the single digital sound signal described above, without repeating the details.

In one embodiment, the plurality of digital sound signals includes a first digital sound signal and a second digital sound signal, a determination time-point for determining whether the first digital sound signal is the clipping sound signal or the non-clipping sound signal is earlier than the determination time-point for determining whether the second digital sound signal is a clipping signal or a non-clipping signal. The plurality of analog gain values includes a first analog gain value and a second analog gain value, the first digital sound signals corresponds to the first analog gain value, the second digital sound signals corresponds to the second analog gain value, the first analog gain value is greater than the second analog gain value.

Figure 3:
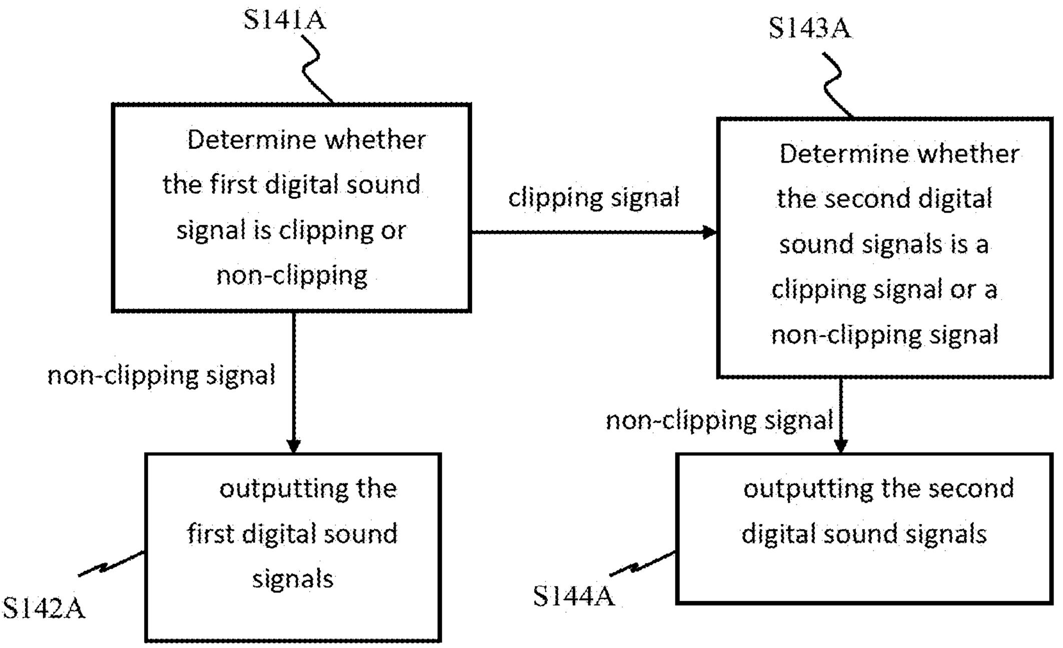
FIG. 3 illustrates the flowchart of determining whether the plurality of digital sound signals are clipping signals or non-clipping signals in the sound signal processing method according to an embodiment of the present application.

The controller 50 determines whether each audio frame of the first digital sound signal and each audio frame of the second digital sound signal is clipping or not. Both the first digital sound signal and the second digital sound signal have the same plurality of audio frames. However, the waveform of the first digital sound signal is different form the waveform of the second digital sound signal. For the same audio frame, the controller 50 first determines whether the first digital sound signal is the clipping signal or the non-clipping signal, when the first digital sound signal is the clipping signal, the controller 50 then proceeds to determine whether the second digital sound signal is the clipping signal or the non-clipping signal. FIG. 3 further depicts a flowchart of the method in this application showing whether a plurality of digital sound signals are clipping signals or non-clipping signals. As shown in FIG. 3, steps for determining whether the plurality of digital sound signals are clipping signals or non-clipping signals include Step S141A to Step S144A. The operation of the sound signal processing device shown in FIG. 1 is used as an example to explain steps S141A to S144A.

Step S141A: determine whether the first digital sound signal is clipping signal or non-clipping signal. Specifically, the controller 50 examines the waveform of the first digital sound signal to determine whether the signal level of the first digital sound signal maintains at a specific level for a certain period of time or not. When the signal level of the first digital sound signal maintains at a specific level for a certain period of time, the controller 50 determines that the first digital sound signal is the clipping signal. When the signal level of the first digital sound signal does not maintain at a specific level for a certain period of time, the controller 50 determines that the first digital sound signals is the non-clipping signal.

When the controller 50 determines the first digital sound signals is the non-clipping signal, the controller 50 proceeds to Step S142A: When the controller 50 determines the first digital sound signals is the clipping signal, the controller 50 proceeds to Step S143A.

Step S142A: outputting the first digital sound signal. Specifically, the controller 50 stops determining whether the second digital sound signal is the clipping signal or the non-clipping signal and sends a control signal to the microprocessor 40, the microprocessor 40 outputs the first digital sound signal.

S143A: determining whether the second digital sound signals is the clipping signal or the non-clipping signal. Specifically, the controller 50 examines the waveform of the second digital sound signals to determine whether the signal level of the second digital sound signals maintains at a specific level for a certain period of time or not. When the signal level of the second digital sound signals maintains at a specific level for a certain period of time, the controller 50 determines that the second digital sound signal is the clipping signal. When the signal level of the second digital sound signals does not maintain at a specific level for a certain period of time, the controller 50 determines that the second digital sound signals is the non-clipping signal.

When the controller 50 determines that the second digital sound signals is the non-clipping signal, the controller 50 proceeds to Step S144A. When the controller 50 determines that the second digital sound signal is the clipping signal, the controller 50 takes no action and records the first digital sound signal and the second digital sound signal are both clipping signals.

Step S144A: outputting the second digital sound signals. Specifically, the controller 50 sends control signals to the microprocessor 40, the microprocessor 40 outputs the second digital sound signals.

In another embodiment, the plurality of digital sound signals includes a first digital sound signals and a plurality of second digital sound signals, the determination time-point for determining whether the first digital sound signal is the clipping signal or the non-clipping signal is earlier than the determination time-point for determining whether the plurality of second digital sound signals is the clipping signal or the non-clipping signal. The plurality of analog gain values include a first analog gain value and a plurality of second analog gain values, the first digital sound signal corresponds to the first analog gain value, the plurality of second digital sound signals respectively correspond to the plurality of second analog gain values, the first analog gain value is greater than the plurality of second analog gain values, the analog gain value of each of the plurality of second analog gain values is different and sequentially decreasing. The chronical sequence of the determination time-points for determining whether each of the plurality of second digital sound signals is the clipping signal or the non-clipping signal is determined based on a numerical order of plurality of second analog gain value.

Figure 4:
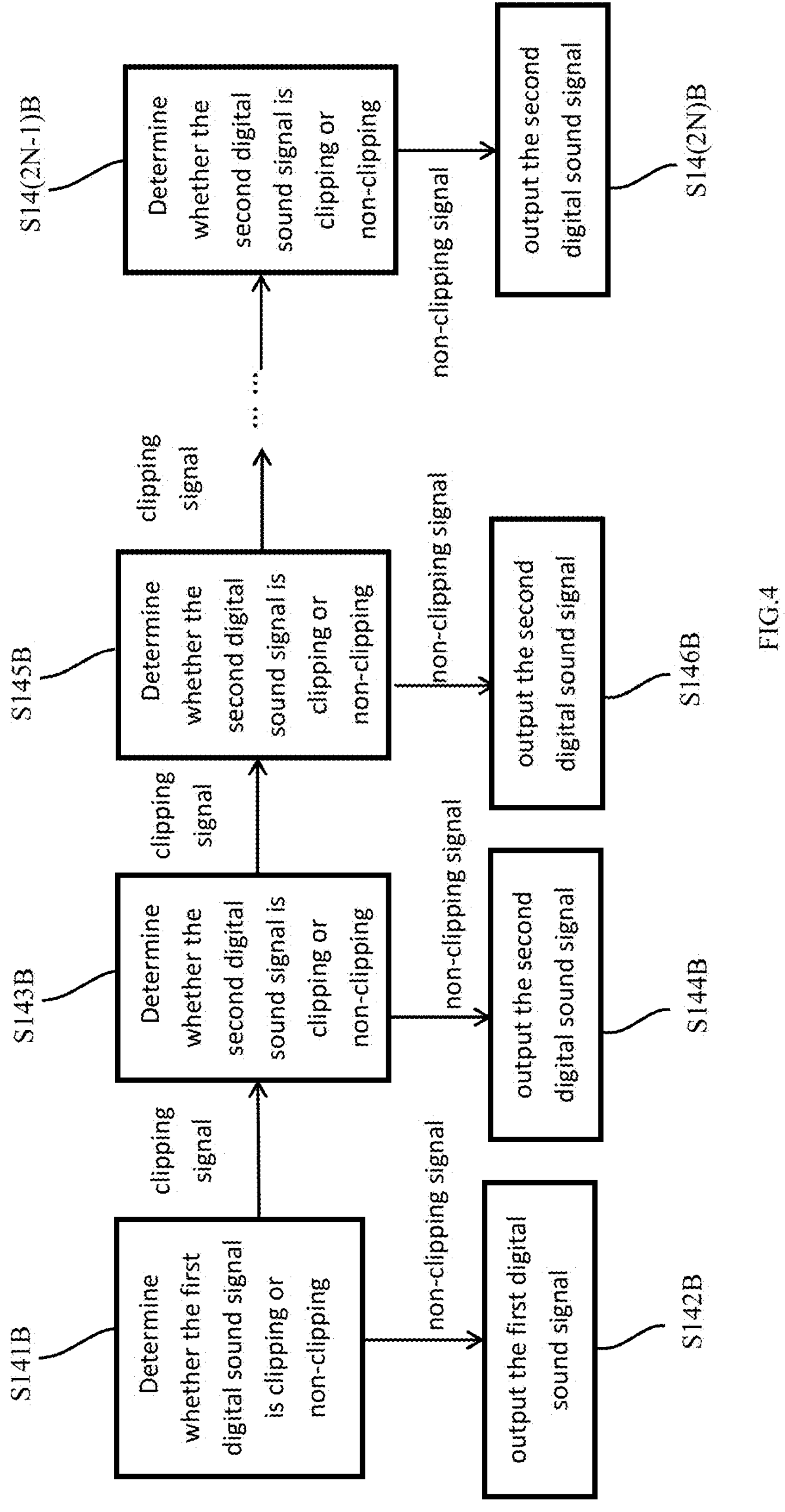
FIG. 4 illustrates the flowchart of determining whether the plurality of digital sound signals are clipping signals or non-clipping signals in the sound signal processing method according to another embodiment of the present application.

The controller 50 determines whether each audio frame of the first digital sound signals and each audio frame of the plurality of second digital sound signal is clipping or not, the first digital sound signal and each audio frame of the second digital sound signals have the same audio frames, however, the waveform of the first digital sound signal differs from the waveforms of the second digital sound signals, and each of the plurality of second digital sound signals has different waveforms. Within the same audio frame, the controller 50 first determines whether the first digital sound signal is the clipping signal or the non-clipping signal. When the controller 50 determines the first digital sound signals is the clipping signal, the controller 50 subsequently determines whether the plurality of second digital sound signals is the clipping signal or the non-clipping signal according to the numerical order of the plurality of second analog gain value. FIG. 4 further illustrates a flowchart of determining whether the plurality of digital audio signal is clipped or non-lipping according to another embodiment of this application. As shown in FIG. 4, the steps for determining whether the plurality of digital sound signals is the clipping signal or the non-clipping signal includes stepS141B to stepS14(2N)B, wherein N is a positive integer. The operation of the sound signal processing device shown in FIG. 1 is used to illustrate steps S141B to S14(2N)B.

In the following discussion, three second digital sound signals will be used as an example to illustrate the steps for determining whether the plurality of digital sound signals is the clipping signal or the non-clipping signal. Specifically, the steps for determining whether plurality of digital sound signals is the clipping signal or the non-clipping signal will be illustrated using the case where (N=4), but these steps also apply to cases where (N=5) and (N=6).

Therefore, the plurality of digital sound signals includes a first digital sound signal and three second digital sound signals, the number of the plurality of second analog gain value is three. The three second digital sound signals include a second digital sound signal D2-1, a second digital sound signal D2-2, and a second digital sound signal D2-3. The three second analog gain values include a second analog gain value G2-1, a second analog gain value G2-2, and a second analog gain value G2-3. The second analog gain value G2-1 is greater than the second analog gain value G2-2, the second analog gain value G2-2 is greater than the second analog gain value G2-3. The second digital sound signal D2-1 corresponds to the second analog gain value G2-1, the second digital sound signal D2-2 corresponds to the second analog gain value G2-2, the second digital sound signal D2-3 corresponds to the second analog gain value G2-3.

After determining that the first digital sound signal is the clipping signal, the controller 50 subsequently determines whether the second digital sound signal D2-1 is the clipping signal or the non-clipping signal. While the second digital sound signal D2-1 is determined to be clipping signal, the controller 50 then determines whether the second digital sound signal D2-2 is the clipping signal or the non-clipping signal. Furthermore, while the second digital sound signal D2-2 is determined to be the clipping signal, the controller 50 proceeds to determine whether the second digital sound signal D2-3 is the clipping signal or the non-clipping signal.

Furthermore, since the preceding paragraph has already described the mechanism for determining whether one first digital sound signal and one second digital sound signals are clipping signals or non-clipping signals, it will not be reiterated here. Steps S141B and S142B are identical to steps S141A and S142B, and therefore will not be described again here.

Step S143B: determining whether the second digital sound signals is the clipping signal or the non-clipping signal. When it is determined that the second digital sound signal D2-1 is a non-clipping signal, proceed to Step S144B. When it is determined that the second digital sound signal D2-1 is a clipping signal, proceed to Step S145B.

Step S144B: outputting the second digital sound signals. Specifically, controller 50 ceases to determine whether the second digital sound signal D2-2 and the second digital sound signal D2-3 is a clipping signal or a non-clipping signal, and transmits control signals to the microprocessor 40, the microprocessor 40 outputs the second digital sound signal D2-1.

Step S145B: determine whether the second digital sound signals are a clipping signal or a non-clipping signal. When the second digital sound signal D2-2 is determined to be a non-clipping signal, proceed to Step S146B. When the second digital sound signal D2-2 is determined to be a clipping signal, proceed to Step S147B.

Step S146B: output the second digital sound signals. Specifically, the controller 50 ceases to determine whether the second digital sound signal D2-3 is a clipping signal or a non-clipping signal and transmits control signals to the microprocessor 40, the microprocessor 40 outputs the second digital sound signal D2-2.

Step S147B: determine whether the second digital sound signal is a clipping signal or a non-clipping signal. When the second digital sound signal D2-3 is determined to be a non-clipping signal, proceed to Step S148B. When the second digital sound signal D2-3 is determined to be a clipping signal, controller 50 does not take action or record the first digital sound signal, the second digital sound signal D2-1, the second digital sound signal D2-2, and the second digital sound signal D2-3 are all clipping signals.

Step S148B: output the second digital sound signals. Specifically, the controller 50 sends control signals to the microprocessor 40, the microprocessor 40 outputs the second digital sound signal D2-3.

Step S15: performing a dynamic range control program on the non-clipping signals, to adjust the non-clipping signals. Specifically, the dynamic range control program includes a digital gain value (make up gain), the controller 50 sends another control signal to the microprocessor 40, the microprocessor 40 performs the dynamic range control program on the non-clipping signals, to adjust non-clipping signals according to the digital gain value.

Figure 5:
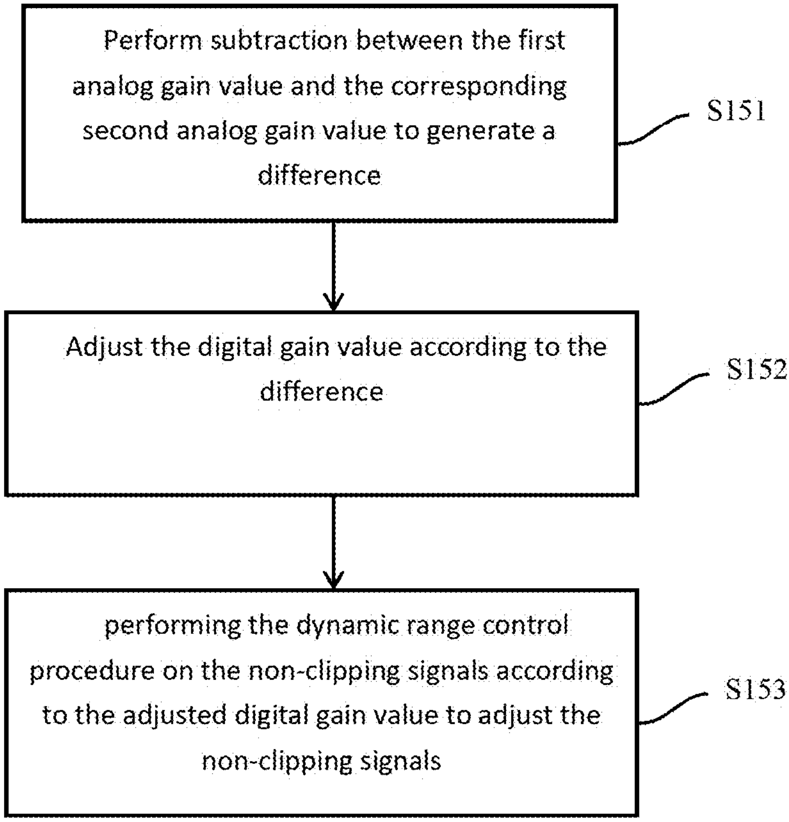
FIG. 5 illustrates the flowchart of performing the dynamic range control program on non-clipping signals in the sound signal processing method according to an embodiment of the present application.

When the first digital sound signal is a non-clipping signal, the microprocessor 40 performs the dynamic range control program on the first digital sound signal according to another control signal, to adjust the first digital sound signal according to the digital gain value. When the second digital sound signal is non-clipping, the controller 50 controls the microprocessor 40 adjust the digital gain value based on the first analog gain value and the corresponding second analog gain value, to compensate the differences between the first digital sound signal and the second digital sound signals determined to be a non-clipping signal. FIG. 5 illustrates the process of performing the dynamic range control program on non-clipping signals in accordance with an embodiment of the sound signal processing method. As shown in FIG. 5, the steps for performing the dynamic range control program on non-clipping signals include steps S151 to Step S153. The operation of the sound signal processing device shown in FIG. 1 will be used as an illustrative example to explain steps S151 to S153.

Step S151: perform subtraction between the first analog gain value and the corresponding second analog gain value to generate a difference. Specifically, the controller 50 obtains the first analog gain value and the corresponding second analog gain value of the non-clipping signal from the pre-amplifier 20 and performs subtraction between the first analog gain value the corresponding second analog gain value of the non-clipping signal to generate a difference.

Step S152: Adjust the digital gain value according to the difference. Specifically, the controller 50 sends the difference and another control signal to the microprocessor 40, the microprocessor 40 adjusts the digital gain value according to the difference and another control signal.

Step S153: performing the dynamic range control program on the non-clipping signal according to the adjusted digital gain value to adjust the non-clipping signal. Specifically, the microprocessor 40 performs the dynamic range control program on the second digital sound signal according to the adjusted digital gain value, to adjust the second digital sound signals.

Figure 6:
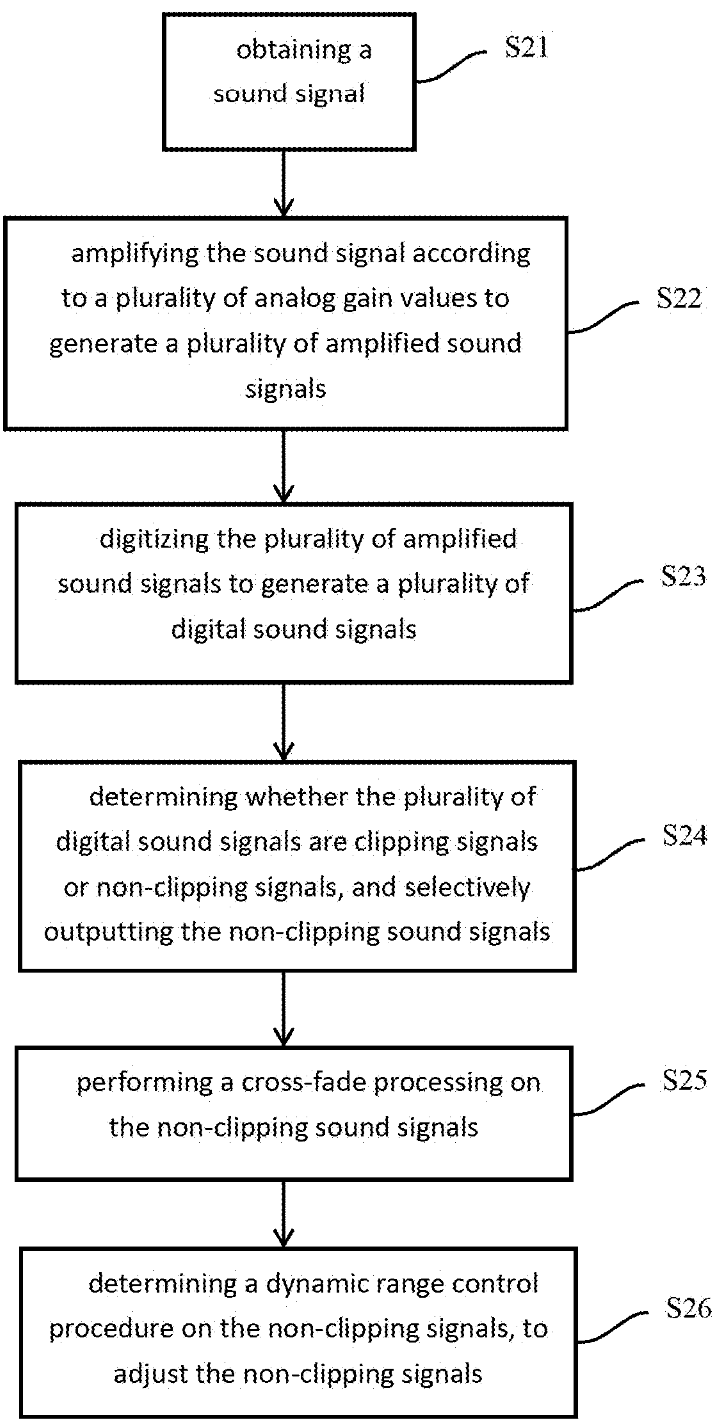
FIG. 6 illustrates the flowchart of the sound signal processing method according to another embodiment of the present application.

FIG. 6 illustrates another embodiment of the sound signal processing method according to this application. As shown in FIG. 6, the sound signal processing method of this application includes steps S21 to S26, where steps S21 to S24 and Step S26 are identical to steps S11 to S15. Below is an illustrative explanation of Step S25 using the operation of the sound signal processing device shown in FIG. 1.

Step S25: Perform cross-fade processing on the non-clipping signal. Specifically, the controller 50 controls the microprocessor 40 to perform cross-fade processing on the first digital sound signal or the second digital sound signals that is determined to be a non-clipping signal. Furthermore, the controller 50 controls the microprocessor 40 to perform a fade-in process on an audio frame of the first digital audio signal or the second digital audio signal that is a non-clipping signal, and controls the microprocessor 40 to perform a fade-out process on a previous audio frame of the first digital audio signal or the second digital audio signal that is a non-clipped signal, wherein the previous audio frame is another audio frame that is earlier than the audio frame.

In summary, the sound signals processing method and the sound signals processing device of the present application, amplify sound signals based on plurality of analog gain values to generate plurality of amplified sound signals, and then digitized the amplified sound signals to generate plurality of digital sound signals. Subsequently, determining the plurality of digital sound signals are clipping signals or non-clipping signals, and selectively outputting non-clipping sound signals, and performing the dynamic range control program on the non-clipping signals. Therefore, after the aforementioned signal processing, no clipping occurs in the sound signal The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present invention is intended to be dedicated to the public regardless of whether the element or component is explicitly recited in the following claims.

What is claimed is:

1. A sound signal processing method, comprising:

obtaining a sound signal;

amplifying the sound signal according to a plurality of analog gain values to generate a plurality of amplified sound signals, wherein the plurality of amplified sound signals corresponds to the plurality of analog gain values respectively, wherein the plurality of analog gain values comprises a first analog gain value and a second analog gain value;

digitizing the plurality of amplified sound signals to generate a plurality of digital sound signals, wherein the plurality of digital sound signals comprises a first digital sound signal and a second digital sound signal, the first analog gain value corresponds to the first digital sound signal and the second analog gain value corresponds to the second digital sound signal, and the first analog gain value is greater than the second analog gain value;

determining whether the plurality of digital sound signals are clipping signals or non-clipping signals, and selectively outputting the non-clipping sound signals, which comprises:

outputting the first digital sound signal when the first digital sound signal is determined to be the non-clipping signal; and outputting the second digital sound signal when the second digital sound signal is determined to be the non-clipping signal and the first digital sound signal is determined to be the clipping signal; and performing a dynamic range control program on the non-clipping sound signals to adjust the non-clipping sound signals when the second digital sound signal is outputted.

2. The sound signal processing method as claimed in claim 1, wherein the dynamic range control program comprises a digital gain value, and said performing the dynamic range control program on the non-clipping sound signals comprises:

performing subtraction between the first analog gain value and the second analog gain value to generate a difference;

adjusting the digital gain value according to the difference; and performing the dynamic range control program on the non-clipping sound signals according to the adjusted digital gain value to adjust the non-clipping sound signals.

3. The sound signal processing method as claimed in claim 1, wherein said determining whether the first digital sound signal is the clipping sound signal or the non-clipping sound signal is earlier than said determining whether the second digital sound signal is the clipping sound signal or the non-clipping sound signal.

4. The sound signal processing method as claimed in claim 1, wherein the plurality of digital sound signals comprises the first digital sound signal and a plurality of second digital sound signals, and wherein said determining whether the plurality of digital sound signals are the clipped sound signals or the non-clipping sound signals, and selectively outputting the non-clipping sound signals, comprises:

outputting the first digital sound signal when the first digital sound signal is determined to be the non-clipping sound signal; and outputting a selected one of the plurality of second digital sound signals when the selected second digital sound signal is determined to be the non-clipping sound signal, and the first digital sound signal and any of the plurality of second digital sound signals determined prior to the selected second digital sound signal are determined to be the clipping signals.

5. The sound signal processing method as claimed in claim 4, wherein the plurality of analog gain values comprises:

a plurality of second analog gain values, wherein the plurality of second digital sound signals respectively corresponds to the plurality of second analog gain values, and the selected second digital sound signal corresponds to one of the plurality of second analog gain values, wherein the dynamic range control program comprises a digital gain values, and said performing the dynamic range control program on the non-clipping sound signals to adjust the non-clipping sound signals, comprises:

performing subtraction between the first analog gain value and the corresponding one of plurality of the second analog gain values to generate the difference;

adjusting the digital gain value according to the difference; and performing the dynamic range control program on the non-clipping sound signals according to the adjusted digital gain value.

6. The sound signal processing method as claimed in claim 5, wherein said determining whether the first digital sound signal is the clipping signal or non-clipping signal is earlier than said determining whether the plurality of second digital sound signals are clipping signals or non-clipping signals, and wherein a chronical sequence for determining whether the plurality of second digital sound signals are the clipping signals or the non-clipping signals is set based on a numerical order of the plurality of second analog gain values.

7. The sound signal processing method as claimed in claim 1, further comprising performing a cross-fade processing on the non-clipping sound signals.

8. A sound signal processing device, comprising:

an audio device for obtaining a sound signal;

a pre-amplifier, connecting to the audio device and having a plurality of analog gain values, for amplifying the sound signal according to a plurality of analog gain values to generate a plurality of amplified sound signals, wherein the plurality of amplified sound signals correspond to the plurality of analog gain values, respectively, wherein the plurality of analog gain values comprises a first analog gain value and a second analog gain value;

an analog digital converter, connecting to the pre-amplifier, for digitizing the plurality of amplified sound signals to generate a plurality of digital sound signals, wherein the plurality of digital sound signals comprises a first digital sound signal and a second digital sound signal, the first analog gain value corresponds to the first digital sound signal and the second analog gain value corresponds to the second digital sound signal, and the first analog gain value is greater than the second analog gain value;

a microprocessor connecting to the analog digital converter and the pre-amplifier, and receiving the plurality of digital sound signals; and a controller, connecting to the analog digital converter and the microprocessor, for determining whether the plurality of digital sound signals are clipping signals or non-clipping signals, and the controller controlling the microprocessor to selectively output the non-clipping sound signals, which comprises:

outputting the first digital sound signal when the first digital sound signal is determined to be the non-clipping signal; and outputting the second digital sound signal when the second digital sound signal is determined to be the non-clipping signal and the first digital sound signal is determined to be the clipping signal;

wherein the controller controls the microprocessor to perform a dynamic range control program on the non-clipping sound signals to adjust the non-clipping sound signals.

9. The sound signal processing device as claimed in claim 8, wherein the microprocessor connects to the pre-amplifier, wherein the dynamic range control program comprises a digital gain value, and when the second digital sound signal is outputted, the controller controlling the microprocessor to perform the dynamic range control program on the non-clipping sound signals to adjust the non-clipping sound signals, comprising:

performing subtraction between the first analog gain value and the second analog gain value to generate a difference;

adjusting the digital gain value according to the difference; and performing the dynamic range control program on the non-clipping sound signals according to the adjusted digital gain value to adjust the non-clipping sound signals.

10. The sound signal processing device as claimed in claim 8, wherein said determining whether the first digital sound signal is the clipping sound signal or the non-clipping sound signal is earlier than said determining whether the second digital sound signal is the clipping sound signal or the non-clipping sound signal.

11. The sound signal processing device as claimed in claim 8, wherein the plurality of digital sound signals comprises the first digital sound signal and a plurality of second digital sound signals, the controller determines whether the plurality of digital sound signals are the clipped sound signals or the non-clipping sound signals, and controls the microprocessor to selectively output the non-clipping sound signals, comprising:

when the first digital sound signal is determined to be the non-clipping sound signal, the controller controls the microprocessor to output the first digital sound signal; and when a selected one of the plurality of second digital sound signals is determined to be—the non-clipping sound signal, and the first digital sound signal and any of the plurality of second digital sound signals evaluated prior to the selected second digital sound signal are determined to be the clipping signals, the controller controls the microprocessor output the selected second digital sound signal that is being determined to be the non-clipping sound signal.

12. The sound signal processing device as claimed in claim 11, wherein the microprocessor connects to the pre-amplifier, the plurality of analog gain values comprise a first analog gain value and a plurality of second analog gain values, the first digital sound signal corresponds to the first analog gain value, and the plurality of second digital sound signals respectively corresponds to the plurality of second analog gain values; the dynamic range control program comprises a digital gain values, and when outputting the second digital sound signal that is being determined to be the non-clipping sound signal, the controller controls the microprocessor to perform the dynamic range control program on the non-clipping sound signal to adjust the non-clipping sound signals, comprising:

performing subtraction between the first analog gain value and the corresponding one of the plurality of second analog gain values to generate a difference;

adjusting the digital gain value according to the difference; and performing the dynamic range control program on the non-clipping sound signals according to the adjusted digital gain value.

13. The sound signal processing device as claimed in claim 12, wherein the said determining whether the first digital sound signal is the clipping signal or non-clipping signal is earlier than for said determining whether the plurality of second digital sound signals are clipping signals or non-clipping signals, and wherein a chronical sequence for determining whether the plurality of second digital sound signals are the clipping signals or the non-clipping signals is determined based on a numerical order of the plurality of second analog gain values.

14. The sound signal processing device as claimed in claim 8, wherein the controller controls the microprocessor to perform a cross-fade processing on the non-clipping sound signals.

* * * * *